United States Patent [19]
Kashio

[11] 3,949,365
[45] Apr. 6, 1976

[54] INFORMATION INPUT DEVICE

[75] Inventor: Toshio Kashio, Tokyo, Japan

[73] Assignee: Casio Computer Co., Ltd., Higashiyamato, Japan

[22] Filed: Feb. 21, 1974

[21] Appl. No.: 444,358

[30] Foreign Application Priority Data
Feb. 26, 1973    Japan.............................. 48-22206
Feb. 26, 1973    Japan.............................. 48-22207

[52] U.S. Cl........................... 340/168 R; 340/365 S
[51] Int. Cl.² ...................... H04Q 9/00; G08C 1/00
[58] Field of Search......... 340/166 R, 168 R, 365 S, 340/147 R

[56] References Cited
UNITED STATES PATENTS

| | | | |
|---|---|---|---|
| 3,483,553 | 12/1969 | Blankenbaker.................. | 340/365 S |
| 3,623,082 | 11/1971 | Stein............................... | 340/365 S |
| 3,651,463 | 3/1972 | Rawson et al. .................. | 340/365 S |
| 3,662,378 | 5/1972 | MacArthur...................... | 340/365 S |
| 3,683,371 | 8/1972 | Holz............................... | 340/365 R |
| 3,819,862 | 6/1974 | Hedges ........................... | 340/312 X |

OTHER PUBLICATIONS
EEE Magazine, May 1969, pp. 24–25 "Scanning Keyboard Encoder".

Primary Examiner—Donald J. Yusko

[57] ABSTRACT

An information input device includes first and second counting means serially connected so as to be cyclically driven, a matrix circuit having row lines connected to an output from the first counting means and column lines, and a timing count value selecting circuit consisting of a plurality of AND circuits the respective one gate of which is connected to the respective column line of the matrix circuit and the respective opposite gate of which is connected to an output from the second counting means. The timing count value selecting circuit is adapted to select count values of the first and second counting means on a count timing basis by both an output of the column line selected at the intersection crossed by the row line which is selected by the output of the first counting means through the operation of the input key and an output from the second counting means. The information input signal provides a coded information signal from both an output from the timing count value selecting circuit and count outputs from the first and second counting means.

2 Claims, 6 Drawing Figures

INFORMATION INPUT DEVICE

This invention relates to an improved information input device capable of obtaining a plurality of information such as numerals, letters etc. as coded information signals by operating information input keys.

Input devices of various computer apparatus are equipped with a plurality of information input keys. With such input devices, a coded information signal corresponding to any operated key is formed and stored into a memory device etc. In this case, the information input key deals with not only numeral information and arithmetic operation command information, but also letter information etc. and, therefore, a wide variety of input information is involved. Consequently, the corresponding coded information signal is formed of numerous bits.

To obtain a coded information signal corresponding to any operated information input key, attempt has been made to connect input lines 1, 2, . . . 64 corresponding to information input keys to the row lines of a matrix circuit as shown in FIG. 1 and select any column line crossed by the row line of the matrix circuit. With such means, however, a matrix circuit of large capacity is required having a plurality of input lines (for example 64 lines in FIG. 1) corresponding to the kinds of input information and difficulty is presented in forming a simple, compact character signal forming circuit. Particularly, the presence of a plurality of matrix circuits corresponding to a number of information input keys renders it necessary to make an elaborate wire connection and a very complicated construction results.

It is accordingly the object of this invention to provide an information input device of simple construction, capable of obtaining a coded information signal from both outputs of first and second counting means, dividing the bit number of the information signal into two parts, and a timing signal obtained on a count timing basis from both an output of any matrix column line selected at any intersection crossed by any matrix row line which is selected by an output from the first counting means through the operation of any input key and an output from the second counting means.

This invention can be more fully understood from the following detailed description when taken in conjunction with the accompanying drawings, in which.

There will be explained one embodiment of this invention by reference to FIG. 2.

Figure 1:
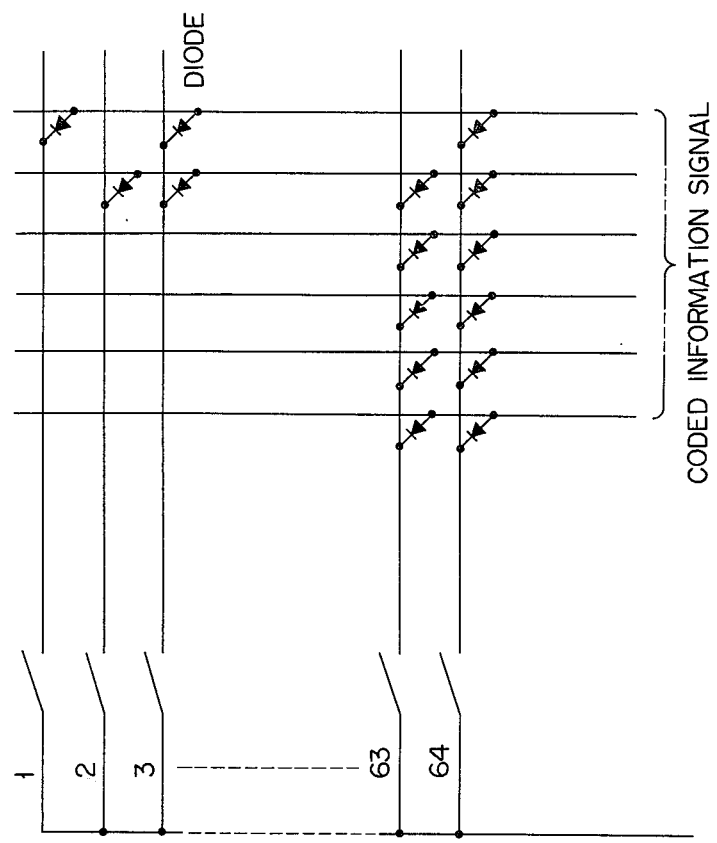
FIG. 1 is a schematic circuit diagram of a conventional information input device.
Figure 2:
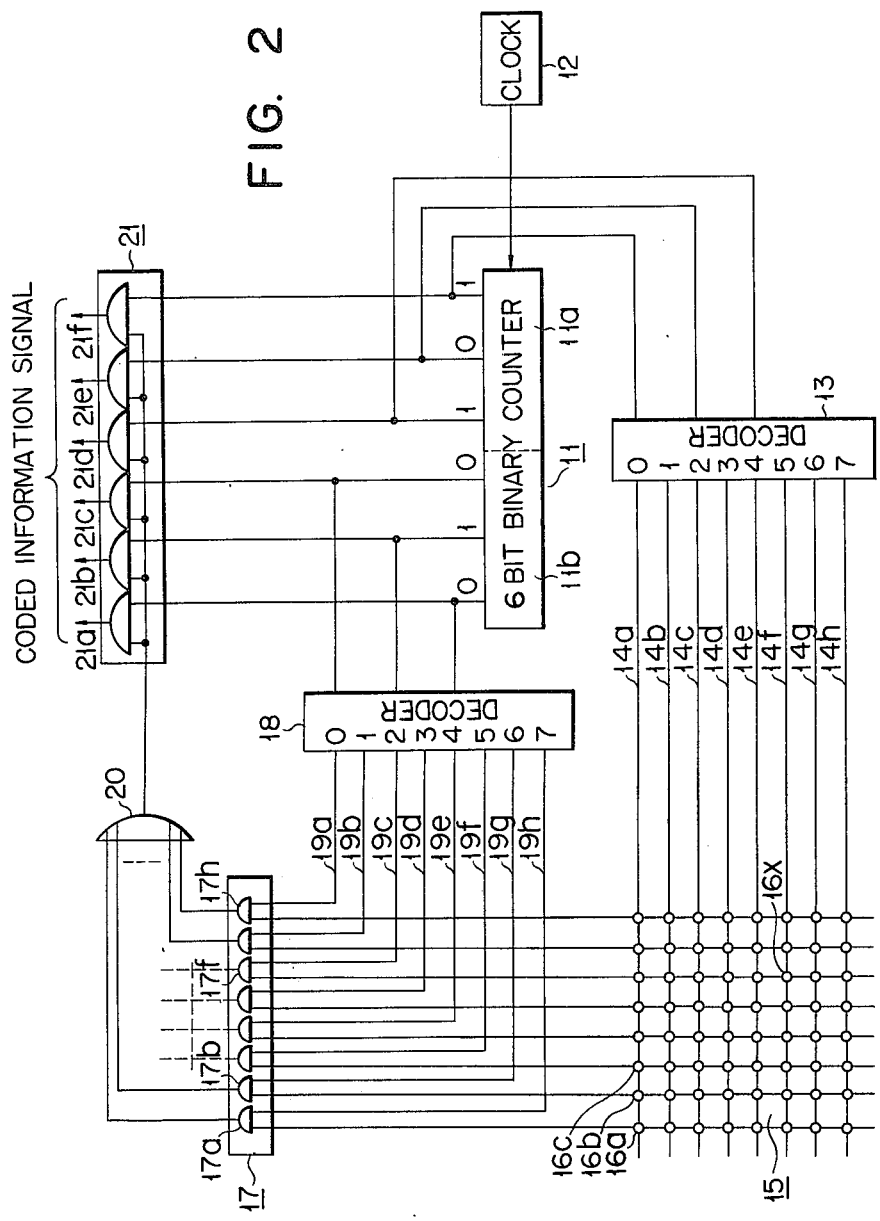
FIG. 2 is a circuit diagram of one embodiment of this invention.

FIG. 2 shows a circuit arrangement. In this circuit arrangement a coded 6-bit signal is shown as an information signal. To obtain the 6-bit signal a 6-bit binary counter 11 is provided. The 6-bit counter is stepped in response to to signals from a clock pulse oscillator 12 to generate a 6-bit count signal. In this case, the binary counter 11 may be considered as consisting of first and second 3-bit binary counters 11a and 11b connected in series. A 3-bit count signal from the first binary counter 11a is coupled to a decoder 13. Eight output lines 14a–14h each corresponding to a 3-bit count value of the first binary counter are taken out from the decoder.

The eight output lines 14a–14h are connected to eight row lines, respectively, of a matrix circuit 15. The matrix circuit 15 includes eight column lines intersected by the eight row lines. Respective information input keys 16a, 16b . . . . . correspond to the respective intersections between the row and column lines. AT the time of the key operation the row and column lines at the corresponding intersection are made to be connected. The eight column lines of the matrix circuit 15 are conncted to AND circuits 17a–17h, respectively.

The second 3-bit binary counter 11b constituting a higher order section of the 6-bit binary counter 11 is driven by a carry signal from the counter 11a. A 3-bit count signal from the binary counter 11b is coupled to a decoder 18 to produce an output at eight output lines 19a–19h. The outputs of the eight output lines 19a–19h are coupled as gate signals to the AND circuits 17a–17h, respectively. These AND circuits 17a–17h constitute a timing count value selecting circuit 17 where a count timing is taken. The outputs of the AND circuits 17a–17h are all connected to an OR circuit 20 and the output of the OR circuit is coupled as a gate signal to AND circuits 21a–21f to which the respective bit signals of the 6-bit binary counter 11 are coupled. These AND circuits 21a–21f may be referred to as an information signal forming circuit 21. With such circuit arrangement the binary counter 11 normally counts pulse signals from the clock pulse oscillator 12 and a 64-scale counting is effected by the 6-bit count signal. With the 3-bit binary counter 11a and 8-scale counting is performed in accordance with the clock pulse, and signals are sequentially derived out from the output lines 14a–14h of the decoder 13 in response to the corresponding counting. With the 3-bit binary counter 11b counting is effected by a carry signal from the counter 11a and an output signal is obtained from the output lines 19a–19h of the decoder 18 in accordance with the corresponding counting. The output signals of the output lines 19a–19h are coupled as gate signals, selectively to the AND circuits 17a–17h.

Suppose that the information input key 16x is operated. when an output signal appears on the output line 14f i.e. the output of the 3-bit binary counter 11a is [101] a signal is coupled to the AND circuit 17f. In this case, if a signal appears on the output line 19c of the decoder 18, a gate signal is applied to the AND circuit 17f and when the output of the 3-bit binary counter 17b is [010] the gate of the AND circuit 17f is opened. Namely, an output from the AND circuit 17f represents a timing value obtained by selecting count values of the binary counters 11a and 11b on a count timing basis. When the 6-bit signal [010101] so appears at the 6-bit binary counter 11 a gate signal is coupled from the AND circuit 17f through OR circuit 20 to the AND circuits 21a–21f and the bit signal [010101] is taken out as an information signal. That is, the relation between the information input keys 16a, 16b . . . . . and the count values of the 6-bit binary counter 11 is so specified and a 6-bit count signal of the counter 11 is taken out as a coded information signal by operating the input keys 16a, 16b . . . . . .

Figure 3:
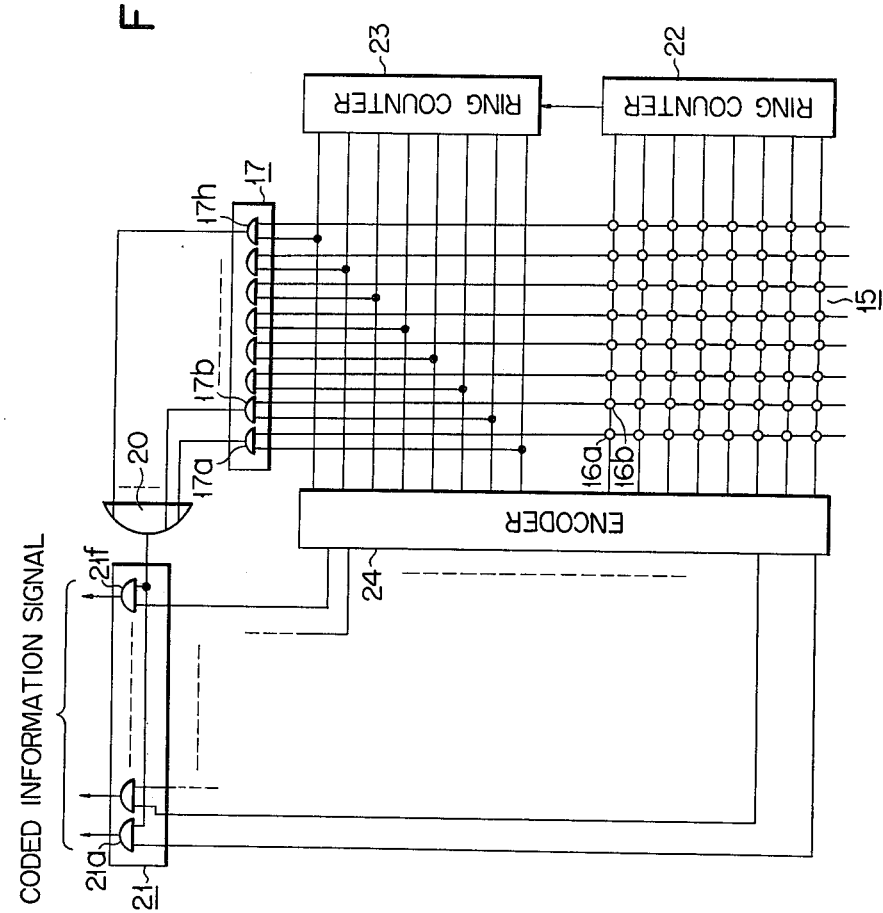
FIGS. 3 to 6 are circuit diagrams each showing a modification of this invention.

Though with the above-mentioned embodiment use is made of the 6-bit binary counter for generating a coded counter signal corresponding to the bit number of an information signal, ring counters 22 and 23 may be used instead as shown in FIG. 3. In the embodiment of FIG. 3 the ring counter 22 is driven by clock pulses and the ring counter 23 is driven by a carry signal from the ring counter 22. The output lines of the ring counter 22 are connected to row lines intersected by column lines of a matrix circuit 15 having information input keys 16a, 16b . . . . . at the corresponding intersections. Output lines of the ring counters 23 are connected as gate signal lines to AND circuits 17a–17h connected rspectively to the column lines of the matrix circuits 15. Like the above mentioned embodiment, a timing signal corresponding to any operated input key is generated at AND circuits 17a–17h. These AND circuits 17a–17h constitute a timing count value selecting circuit 17 where the count timing of the ring counters 22 and 23 is taken. Count value signals from the ring counters 22 and 23 are supplied to an encoder 24 and a coded output signal of the encoder 24 is directly coupled to AND circuits 21a–21f the gate of which is opened by an output signal of the OR circuit 20. The count values of the ring counters 22 and 23 are specified by operating the information input keys 16a, 16b . . . . . and the gate of AND circuits 21a–21f is opened upon receipt of timing information signals from the ring counters 22 and 23 and a coded information signal is derived out. These AND circuits 21a–21f should be referred to as an information signal forming means.

Figure 4:
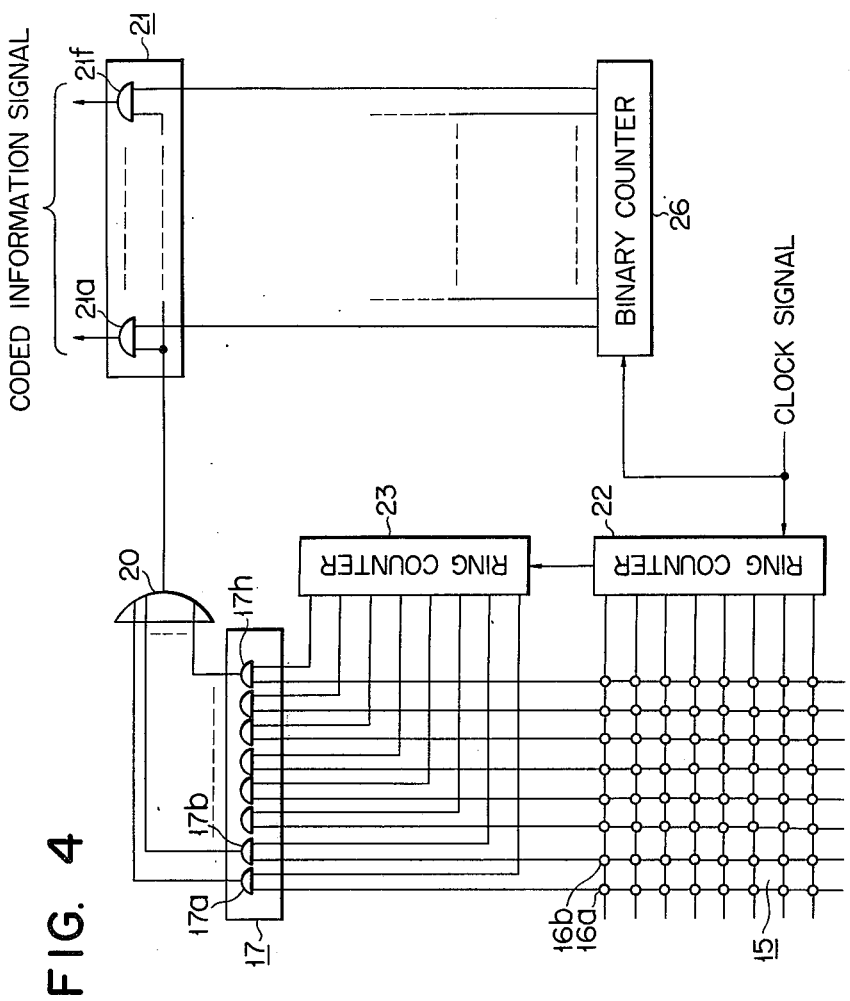

As shown in FIG. 4 clock pulses which are supplied to ring counters 22 and 23 may be supplied to a separate binary counter 26 and a code signal of the binary counter 26 may be directly derived out, by a matrix circuit 15 and thus input keys 16a, 16b . . . . . , on a count timing basis, since the counting of the ring counters 22 and 23 is effected in synchronism with the counting of the binary counter 26.

Figure 5:
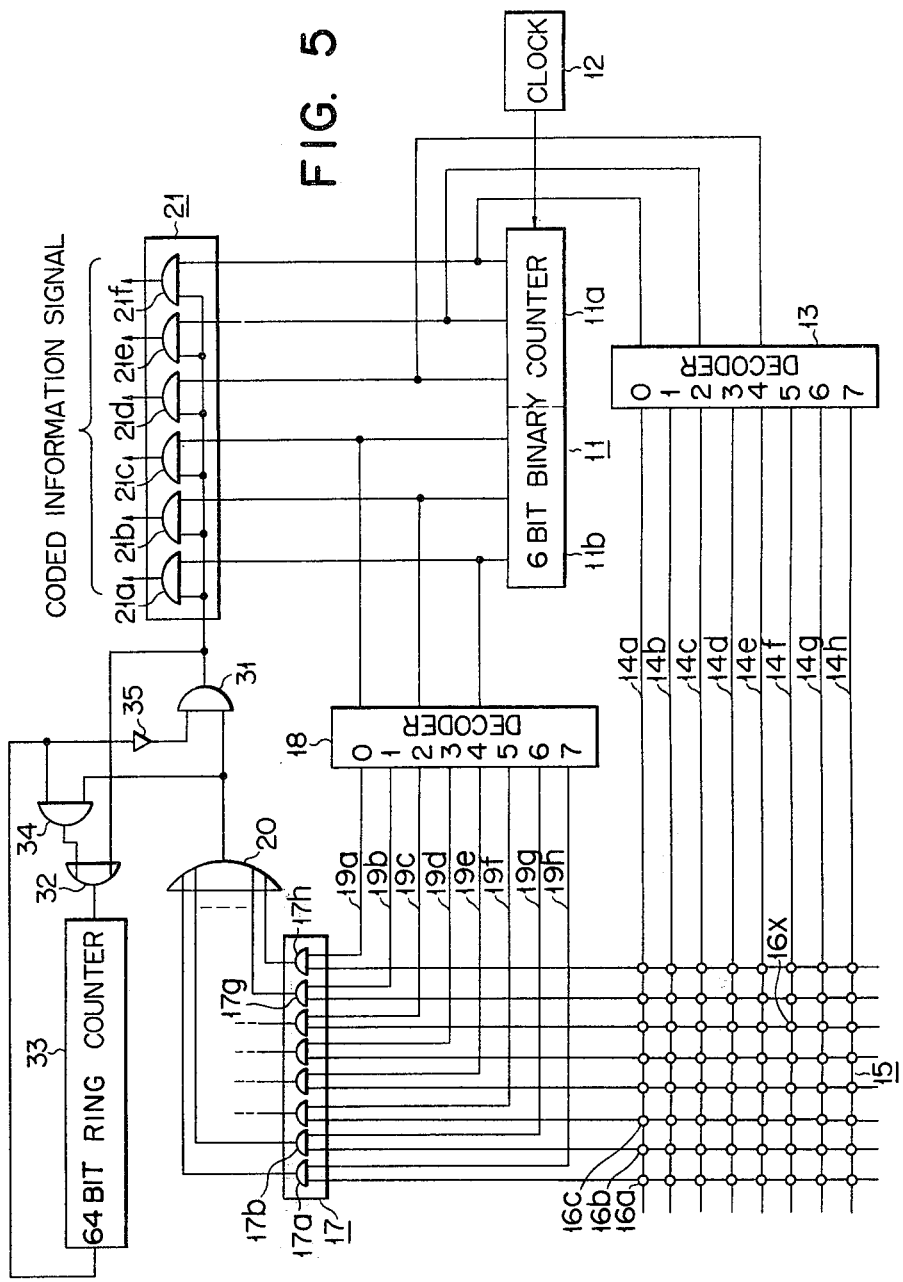

There will be explained another embodiment of this invention by reference to FIG. 5. With this embodiment information input keys are operated at rapid speed and even when the plural input keys are substantially simultaneously operated, coded information signals corresponding to any operated input keys are sequentially obtained without error. The same reference numerals are employed to designate like parts or elements corresponding to those of the embodiment of FIG. 2 and any further explanation is therefore omitted. In the Figure, the outputs of AND circuits 17a–17h, constituting a timing count value selecting circuit 17, are all coupled to an OR circuit 20 and the output of the OR circuit 20 is coupled to an AND circuit 31. An output signal from the AND circuit 31 is coupled as a gate signal to a coded information signal forming circuit 21 consisting of AND circuits 21a–21f to which bit signal of a 6-bit binary counter 11 is coupled. The output signal from the AND circuit 31 is coupled as a write signal to a 64-bit ring counter 33 through an OR circuit 32. The ring counter 33, though not shown in detail, consists of a shift register driven to make one cycle in synchronism with the cyclic counting of the 6-bit binary counter 11. An output signal of the binary counter 33 is coupled, together with a signal from the OR circuit 20, to an AND circuit 34 whose output is circulated back to the ring counter 33 through an OR circuit 32. The output signal of the binary counter is also coupled as a gate signal to the AND circuit 31 through an inverter 35. A coded 6-bit information signal can be obtained from the AND circuits 21a–21f to which signals from the binary counter 11 are coupled.

When any input key is not operated, the memory content of the 64-bit ring counter 33 is [0]. Since the output of the inverter 35 is [1] a gate signal is applied to the AND circuit 31. In this state, suppose that a gate signal is supplied to one gate of the AND circuit 17f by operating the information input key 16x. When an output appears on the line 19c, an output from the timing count value selecting circuit 17 represents a selected timing output obtained on a count timing basis. The selected timing output is written into the 64-bit binary counter 33 through OR circuit 20, AND circuit 31 and OR circuit 32. At this time, when the information input key 16x is still kept operated, an output signal is taken out from the OR circuit 20. From the ring counter 33, however, the previously written timing signal is derived out. Since an output of the inverter 35 is [0] no gate signal is applied to AND circuits 21a–21f. That is, only one coded information signal is taken out by a simple key operation. After release of the input key, no output appears from the OR circuit 20. Since the gate of the AND circuit 34 is not opened, the timing information stored in the ring counter 33 is erased.

Suppose that, when the input key 16x is being operated, another input key is operated. Then, information corresponding to the input key 16x is taken out as mentioned above. A timing signal corresponding to the next successively operated input key is derived, likewise, from the OR circuit 20, but the signal timing is different from that of the preceding signal. Therefore, at the time when the next successive signal is coupled to the AND circuit 31, the output of the ring counter 33 is [0] and a signal is taken out from the AND circuit 31. The code signal corresponding to the next successively operated key is derived out from the AND circuits 21a–21f and at the same time its timing signal is written into the ring counter 33. That is, even when the plural input keys 16a, 16b . . . . are substantially simultaneously operated at rapid speed, it is possible to obtain, without fail, a coded information signal corresponding to any operated input key.

Figure 6:
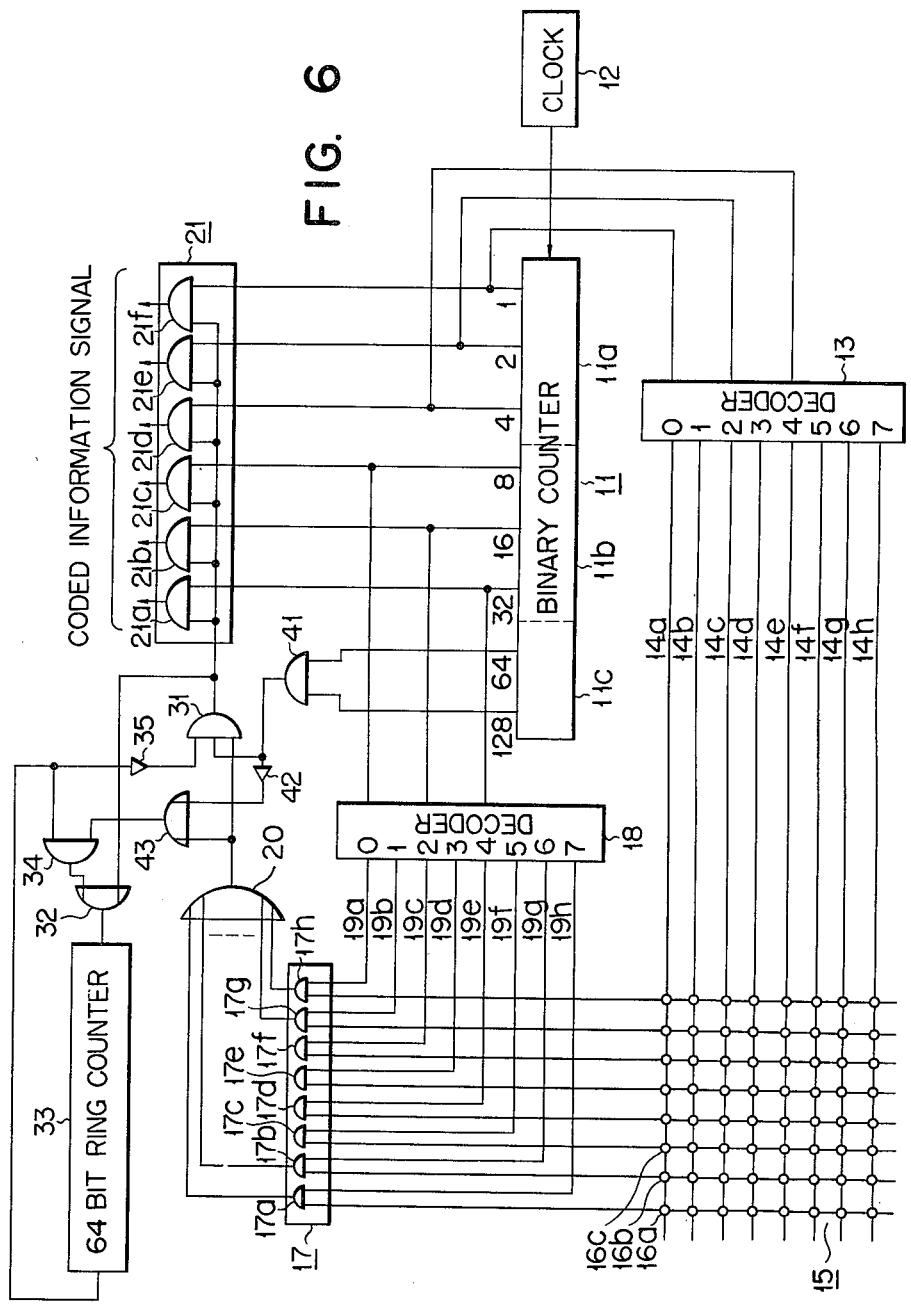

With an embodiment shown in FIG. 6, an accurate, coded information signal is obtained without any hindrance even when chattering is produced at the time of operating information input keys. The same reference numerals are employed to denote parts or elements corresponding to those of the embodiment of FIG. 5 and any further explanation is therefore omitted. Another 2-bit binary counter 11c is arranged ahead of the higher order section of the 6-bit binary counter 11. The 2-bit binary counter 11c is driven by carry signal from the higher order section i.e., a 3-bit binary counter 11b, of the counter 11. The outputs of the 2-bit binary counter 11c are coupled to an AND circuit 41 and when the content of the counter 11c is [11] an output signal is obtained from the AND circuit 41. The output signal of the AND circuit 41 is coupled as a gate signal to an AND circuit 31. An OR circuit 43 is arranged between an OR circuit 20 and an AND circuit 34 and the output of the AND circuit 41 is coupled through an inverter 42 to the OR circuit 43. A ring counter 33 is set to be driven in synchronism with the counting of the binary counter 11. That is, with this embodiment, only when the content of the 2-bit binary counter 11c is [11] the gate of an AND gate 31 is opened. The AND gate 31 samples a timing signal from the OR circuit 20 for each four counting cycle of the binary counter 11 and the output of the AND circuit 31 is supplied to AND circuits 21a–21f. In this case, for example, if the time required for each four counting cycle of the binary counter 11 is set to be more than a chattering generating time of the input key, for example, more than 5 m sec., an accurate information output signal is always obtained even if chattering is generated at the time of operating the input keys 16a, 16b . . . . .

Though with the embodiment shown in FIG. 6 the binary counter 11 is used as a counting means, ring counters may be used instead as shown in FIGS. 3 and 4.

With the above-mentioned information input devices in which a plurality of input keys are selectively operated, a coded information signal associated with the operation of the input key is very effectively obtained without involving any complicated structure. Accordingly, the information input device according to this invention can be effectively applied to various computer apparatus and input devices for recording character information etc.

A backward flow preventing circuit, though not shown in the Figures, may be provided, as required, in the matrix circuit 15.

Though the binary counter 11a is connected to the row lines of the matrix circuit 15, the binary counter 11b may be connected to the row lines of the matrix circuit 15 and the binary counter 11a may be connected to the AND circuits 17a–17h.

What is claimed is:

1. In a data input device comprising a matrix circuit in which the intersections between row and column lines are connected selectively by operation of a plurality of information input keys: a first counting means sequentially driven by clock pulses so as to effect a cyclical counting and adapted to supply outputs corresponding to its count value to the corresponding row line of the matrix circuit; a second counting means connected in series with the first counting means so as to effect a cyclical counting; means for providing a selected synchronizing signal corresponding to a selected intersection upon receipt of the output from the first counting means through the row and column lines defining the intersection selected by the operation of the information input keys and of the output from the second counting means; a memory means for storing the timing at which the selected synchronizing signal is to be produced; a logic circuit adapted to detect either of the coincidence and non-coincidence between the timing at which the selected synchronizing signal is produced and the timing stored in the memory means and to control the transfer of the selected synchronizing signal in accordance with the detection; and means for providing a coded information signal upon receipt of the selected synchronizing signal from the logic circuit and of the count value output of the first and second counting means.

2. In a data input device comprising a matrix circuit in which the intersections between row and column lines are connected selectively by operation of a plurality of information input keys: a first counting means sequentially driven by clock pulses so as to effect a cyclical counting and adapted to supply outputs corresponding to its count value to the corresponding row line of the matrix circuit; a second counting means connected in series with the first counting means so as to effect a cyclical counting; a third counting means connected in series with the second counting means and adapted to provide an output corresponding to an integral multiple of the counting cycle of said first and second counting means; means for providing a selected synchronizing signal corresponding to a selected intersection upon receipt of the output from the first counting means through the row and column lines defining the intersection selected by the operation of the information input keys and of the output from the second counting means; a memory means for storing the timing at which the selected synchronizing signal is to be produced; a first logic circuit adapted to detect either of the coincidence and non-coincidence between the timing at which the selected synchronizing signal is produced and the timing stored in the memory means and to control the transfer of the selected synchronizing signal in accordance with the detection; a second logic circuit for sampling the selected synchronizing signal obtained from the first logic circuit when the third counting means provides an output; and means for providing a coded information signal upon receipt of the selected synchronizing signal obtained under control of the first and second logic circuits and of the count value outputs of the first and second counting means.

* * * * *